United States Patent
Lan et al.

(10) Patent No.: US 9,080,252 B2
(45) Date of Patent: Jul. 14, 2015

(54) METHOD OF MANUFACTURING CRYSTALLINE SILICON INGOT

(75) Inventors: Chung-Wen Lan, Xindian (TW); Ya-Lu Tsai, Taoyuan County (TW); Sung-Lin Hsu, Zhubei (TW); Chao-Kun Hsieh, Xinfeng County (TW); Wen-Chieh Lan, Keelung (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 137 days.

(21) Appl. No.: 13/098,051

(22) Filed: Apr. 29, 2011

(65) Prior Publication Data

US 2011/0303143 A1 Dec. 15, 2011

(30) Foreign Application Priority Data

Jun. 15, 2010 (TW) .............................. 099119357 A

(51) Int. Cl.
| | |
|---|---|
| C30B 11/02 | (2006.01) |
| C01B 33/021 | (2006.01) |
| C30B 11/14 | (2006.01) |
| C30B 28/06 | (2006.01) |
| C30B 29/06 | (2006.01) |
| C30B 11/00 | (2006.01) |

(52) U.S. Cl.
CPC ............... *C30B 11/14* (2013.01); *C30B 11/002* (2013.01); *C30B 28/06* (2013.01); *C30B 29/06* (2013.01); *C30B 11/00* (2013.01); *C30B 11/003* (2013.01); *C30B 11/02* (2013.01)

(58) Field of Classification Search
CPC ...... C30B 11/002; C30B 11/14; C30B 28/06; C30B 29/06
USPC ............................................. 117/81; 264/332
See application file for complete search history.

(56) References Cited

U.S. PATENT DOCUMENTS

| | | | | |
|---|---|---|---|---|
| 4,540,914 A | * | 9/1985 | Maple ........................... | 313/466 |
| 4,717,444 A | * | 1/1988 | Hill et al. ........................ | 117/83 |
| 6,106,617 A | * | 8/2000 | Yatsurugi ...................... | 117/214 |

(Continued)

FOREIGN PATENT DOCUMENTS

| | | |
|---|---|---|
| EP | 0 887 442 A1 | 12/1998 |
| EP | 1 739 209 A1 | 1/2007 |

(Continued)

OTHER PUBLICATIONS

European Search Report for EP 11 16 9948 dated Sep. 27, 2011, pp. 1-7.

(Continued)

*Primary Examiner* — Michael Kornakov
*Assistant Examiner* — Hua Qi
(74) *Attorney, Agent, or Firm* — Osha Liang LLP

(57) ABSTRACT

An approach is provided for a method to manufacture a crystalline silicon ingot. The method comprises providing a mold formed for melting and cooling a silicon feedstock by using a directional solidification process, disposing a barrier layer inside the mold, disposing one or more silicon crystal seeds on the barrier layer, loading the silicon feedstock on the silicon crystal seeds, heating the mold to obtain a silicon melt, and cooling the mold by the directional solidification process to solidify the silicon melt into a silicon ingot. The mold is heated until the silicon feedstock is fully melted and the silicon crystal seeds are at least partially melted.

10 Claims, 8 Drawing Sheets

(56) References Cited

U.S. PATENT DOCUMENTS

| | | | |
|---|---|---|---|
| 6,136,091 A * | 10/2000 | Yamazaki et al. | 117/81 |
| 2004/0211496 A1* | 10/2004 | Khattak et al. | 148/538 |
| 2007/0169685 A1* | 7/2007 | Stoddard | 117/13 |
| 2009/0031535 A1* | 2/2009 | Jonczyk | 23/308 R |
| 2009/0130014 A1* | 5/2009 | Fukuyama et al. | 423/349 |
| 2010/0193664 A1* | 8/2010 | Stoddard | 249/114.1 |

FOREIGN PATENT DOCUMENTS

| | | |
|---|---|---|
| EP | 2 025 780 A2 | 2/2009 |
| EP | 2 028 292 A2 | 2/2009 |
| EP | 2025780 A2 | 2/2009 |
| JP | 11-011924 A | 1/1999 |
| JP | 2008544937 A | 12/2008 |
| JP | 2009523693 A | 6/2009 |
| WO | WO 2007/084934 A2 | 7/2007 |
| WO | 2009014961 A1 | 1/2009 |
| WO | WO 2009/014961 A1 | 1/2009 |

OTHER PUBLICATIONS

Office Action issued in corresponding Japanese Application No. 2011-129950 dated Jan. 13, 2015, and English translation thereof (10 pages).

* cited by examiner

METHOD OF MANUFACTURING CRYSTALLINE SILICON INGOT

Embodiments relate to a method for manufacturing a crystalline silicon ingot, especially to a method for manufacturing a crystalline silicon ingot with a low defect density and minimized contamination from a mold (e.g. a crucible), and to a method for recycling a silicon seed used in manufacturing the crystalline silicon ingot.

BACKGROUND

Most solar cells absorb parts of sunlight to have the photovoltaic (PV) effect. The raw materials for solar cells contain mostly silicon, because silicon is the second most easily accessible chemical element on earth, and silicon has advantages of low cost, no toxicity and high stability. Further, silicon is widely used in the semiconductor industry.

Silicon materials for solar cells include mono-crystalline silicon, poly-crystalline silicon and amorphous silicon. In General, poly-crystalline silicon is chosen due to its lower cost, comparing with the mono-crystalline silicon that is made from conventional growth techniques (e.g. the Kyropolus and Czochralski (CZ) growth method and the floating zone method (FZ) method).

In general, a solar cell made of poly-crystalline silicon is made by using a known technique. In short, the process of the technique is first to put the high purity silicon melt in a mold (i.e. a quartz crucible), then cool the mold to solidify the silicon melt into a silicon ingot. The silicon ingot then is cut into slices of a wafer size for solar cell applications.

During the poly-crystalline silicon ingots manufacturing process, defects exist among silicon grains, which reduce the solar cell conversion efficiency. The defects include, for example, dislocation, grain boundary, etc., have high probability of forming a recombination center to reduce the lifetime of minority carriers (e.g. electronics). In other words, the defect density in multi-crystalline silicon greatly impacts component structures, characteristics and carrier transportation speeds. The prior art mostly focuses on making poly-crystalline silicon ingot with a low defect density or with harmless defects (e.g. twin boundary etc.).

However, no known prior-art technique has been introduced for reducing the crucible contamination to the edges of the crystalline silicon ingot which contacts with the mold and have to remove as waste due to the contamination.

In addition, most known manufacturing methods for silicon crystalline ingots use the mono-crystalline silicon seeds. The mono-crystalline silicon seeds account for a high percentage to overall manufacturing cost. Also, in solar cell industry, no prior-art technique has been found using low defect density poly-crystalline silicon as seeds to replace the mono-crystalline silicon, which lowers the cost for seeds used in silicon crystalline ingots fabrication.

Further, known methods for manufacturing a silicon ingot with a low defect density or harmless defects have high manufacturing cost.

Some Exemplary Embodiments

These and other needs are addressed by the exemplary embodiments, in which one approach provided for manufacturing a crystalline silicon ingot with a low defect density and minimizing contamination from a mold (e.g. a crucible).

Another approach is provided for recycling and reusing the silicon seed used in manufacturing crystalline silicon ingots.

Another approach is provided for lowering manufacturing costs of crystalline silicon ingots with a low defect density or harmless defects.

According to one embodiment, a method for manufacturing a crystalline silicon ingot comprises providing a mold formed for melting and cooling a silicon feedstock using a directional solidification process, disposing a barrier layer inside the mold, disposing one or more silicon crystal seeds on the barrier layer, loading the silicon feedstock on the silicon crystal seeds, obtaining a silicon melt by heating the mold until the silicon feedstock is fully melted and the silicon crystal seeds are at least partially melted, and cooling the mold by the directional solidification process to solidify the silicon melt into a silicon ingot.

According to another embodiment, a method for manufacturing a crystalline silicon ingot comprises providing a mold formed for melting and cooling a silicon feedstock using a directional solidification process, and disposing a multi-layer structure inside the mold so that the barrier of the multi-layer structure contacts with mold bottom. The multi-layer structure comprises a barrier layer disposed onto a bottom of the mold and at least one silicon crystal seed layer contacting the barrier layer. The method further comprises loading the silicon feedstock on the silicon crystal seed layer, obtaining a silicon melt by heating the mold until the silicon feedstock is fully melted and the silicon crystal seed layer is at least partially melted, and cooling the mold by the directional solidification process to solidify the silicon melt into a silicon ingot.

In an embodiment, the barrier layer can be made of material having a melting point higher than 1400° C. The material may be silicon, high purity graphite, aluminum oxide, silicon carbide, silicon nitride, aluminum nitride, silicon oxide, carbide, nitride, oxide, other ceramic materials or mixtures of above-mentioned compounds.

In an embodiment, the one or more silicon crystal seeds include one or more mono-crystalline silicon crystal seeds, and/or one or more poly-crystalline silicon crystal seeds.

In an embodiment, the silicon crystal seed layer includes one or more silicon crystal seeds.

In an embodiment, the silicon crystal seed layer and the silicon crystal seed have the characteristic of a low defect density. The low defect density characteristic can be expressed as an etching pit density below $1 \times 10^5$ cm$^2$, an average grain size larger than 2 cm, an impurity density smaller than 10 ppma, or a combination thereof.

In an embodiment, the diffusivity (i.e. diffusion coefficient) of impurities in the barrier layer is smaller than the diffusivity of impurities in the mold.

According to another embodiment, a method for manufacturing a crystalline silicon ingot comprises providing a mold formed for melting and cooling a silicon feedstock using a directional solidification process, and disposing one or more silicon crystal seeds inside the mold, each silicon crystal seed comprising at least one silicon crystal grain and having an etching pit density below $1 \times 10^5$ cm$^{-2}$, an average grain size larger than 2 cm, an impurity density smaller 10 ppma, or a combination thereof. The method further comprises loading the silicon feedstock on the silicon crystal seeds, obtaining a silicon melt by heating the mold until the silicon feedstock is fully melted and the silicon crystal seeds are at least partially melted, and cooling the mold by the directional solidification process to solidify the silicon melt into a silicon ingot.

Accordingly, comparing to conventional manufacturing methods, the manufacturing method in accordance with the exemplary embodiments manufactures a crystalline silicon ingot with a low defect density, a minimized contamination by a mold (e.g. a crucible). The method further allows the silicon crystal seed to be reused and recycled.

Still other aspects, features, and advantages of the exemplary embodiments are readily apparent from the following detailed description, simply by illustrating a number of particular embodiments and implementations, including the best mode contemplated for carrying out the exemplary embodiments. The exemplary embodiments are also capable of other and different embodiments, and their several details can be modified in various obvious respects, all without departing from the spirit and scope of the exemplary embodiments. Accordingly, the drawings and description are to be regarded as illustrative, and not as restrictive.

BRIEF DESCRIPTION OF THE DRAWINGS

The exemplary embodiments are illustrated by way of examples, and not by way of limitation, in the figures of the accompanying drawings in which like reference numerals refer to similar elements and in which.

DESCRIPTION OF THE PREFERRED EMBODIMENT

FIGS. 1A to 1E are cross-sectional view of exemplary illustrations for a method for manufacturing a crystalline silicon ingot according to a first embodiment.

Figure 1A:
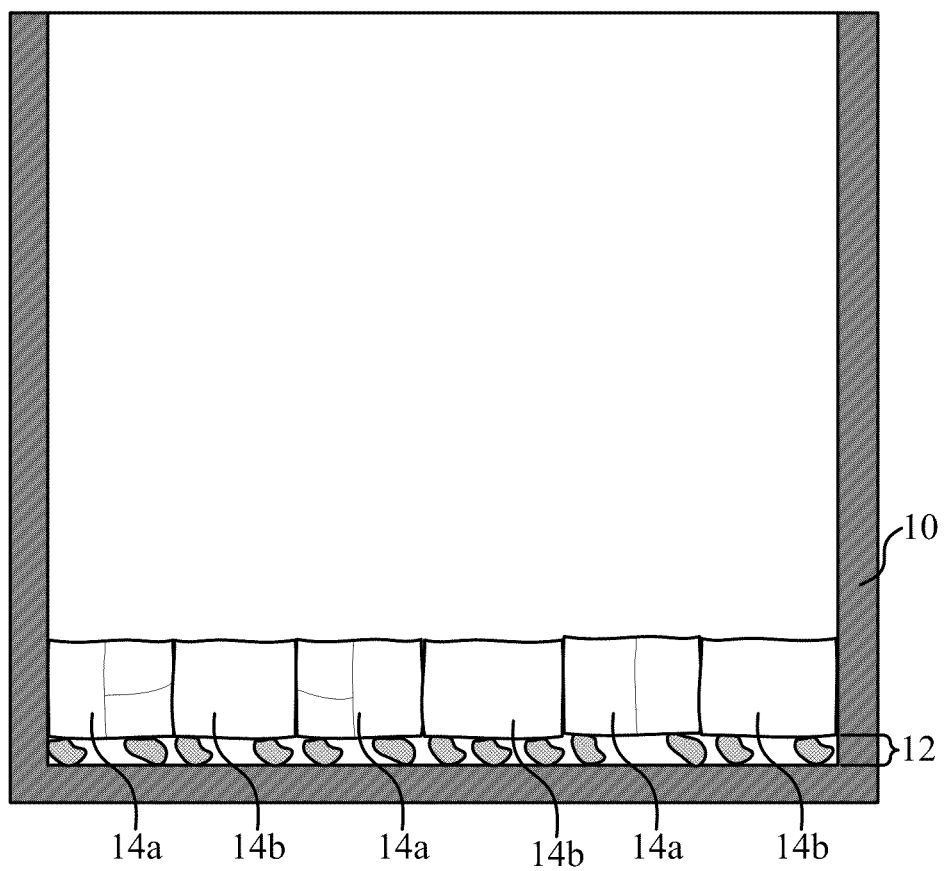
FIGS. 1A-1E are cross-sectional view of exemplary illustrations for manufacturing a crystalline silicon ingot according to a first embodiment.

As shown in FIG. 1A, a method for manufacturing a crystalline silicon ingot first comprises providing a mold 10 in accordance with an embodiment. The mold 10 is suitable for implementing a directional solidification process in melting and cooling a silicon feedstock. In this example, the mold 10 may be a quartz crucible.

The method further comprises disposing a barrier layer 12 and one or more silicon crystal seeds 14a, 14b inside the mold 10, and the silicon crystal seeds 14a, 14b are disposed on the barrier layer 12. The one or more silicon crystal seeds may include a mono-crystalline (single-crystalline) silicon crystal seed (e.g. 14b in FIG. 1A), for example, cut from a mono-crystalline silicon ingot, a tail material, a recycled silicon wafer, etc. The one or more silicon crystal seeds may also include a poly-crystalline (multi-crystalline) silicon crystal seed (e.g. 14a in FIG. 1A), for example, cut from a poly-crystalline silicon ingot. The one or more silicon crystal seeds may include a combination of one or more mono-crystalline silicon crystal seeds 14b and one or more poly-crystalline silicon crystal seeds 14a. In one embodiment, the one or more silicon crystal seeds completely cover the barrier layer 12. By way of example, as shown in FIG. 1A, mono-crystalline silicon crystal seeds 14b and poly-crystalline silicon crystal seeds 14a are mixed and completely cover the barrier layer 12.

Accordingly, disposing the barrier layer 12 between the silicon crystal seeds 14a, 14b and the mold 10 can avoid the silicon crystal seeds and disposed the silicon feedstock of the silicon crystal seed directly contacting with the bottom of the mold 10. In the manufacturing process, the barrier layer 12 can not be melted. In addition, impurities diffused from the barrier layer 12 to the crystalline silicon ingot need to be greatly reduced to avoid contamination. Therefore, the diffusivity (i.e. diffusion coefficient) of impurities in the barrier layer 12 is set to be smaller than the diffusivity of impurities in the mold 10. In one embodiment, the barrier layer 12 can be made of material having melting point higher than 1400° C. The material of the barrier layer 12 may be silicon, high purity graphite, aluminum oxide, silicon carbide, silicon nitride, aluminum nitride, silicon oxide, carbide, nitride, oxide, other ceramic materials or mixtures of above-mentioned compounds. Further, the barrier layer 12 can be formed in scraps and in to separate a silicon feedstock from the mold 10 while reducing the contact area between the barrier layer 12 and the bottom surface of the mold 10, and to reduce impurity diffusion from the barrier layer 12 to the crystalline silicon ingot. In other words, diffusive impurities of the barrier layer 12 to the crystalline silicon ingot can be more greatly reduced. Further, the barrier layer 12 can be partially disposed on the bottom of the mold 10 to increase a space formed between the one or more silicon crystal seeds 14a, 14b and the mold 10, and to further decrease impurities diffused from the barrier layer 12 to the crystalline silicon ingot. By way of example, in an exemplary embodiment that shown in FIG. 1A, the barrier layer 12 is in scraps and partially disposed on the bottom of the mold 10, which is not fully covering the bottom surface of the mold 10. In this embodiment, the barrier layer 12 supports and separates the silicon crystal seed 14a, 14b from contacting the bottom surface of the mold 10, and more particularly, the barrier layer 12 includes significant gaps between barrier layer scraps respectively. The gaps between the scraps of the barrier layer 12 are optionally filled with an inert gas or a protective gas (i.e. nitrogen) that are commonly used in manufacturing processes.

In other exemplary embodiment, the barrier layer 12 may also be a high purity graphite plate or a silicon carbide plate, to avoid contaminations from the barrier layer 12 to the crystalline silicon ingot, and to reduce impurities of the barrier layer 12 diffused to the silicon crystal seeds. It is noted that various forms of the barrier layer 12 and the silicon crystal seed may be applied in the manufacturing process. The barrier layer 12 constructed in scraps inherently has smaller aggregated heat conducting area. On the contrary, the barrier layer 12 constructed in plates has a larger aggregated heat conducting area.

Figure 1B:
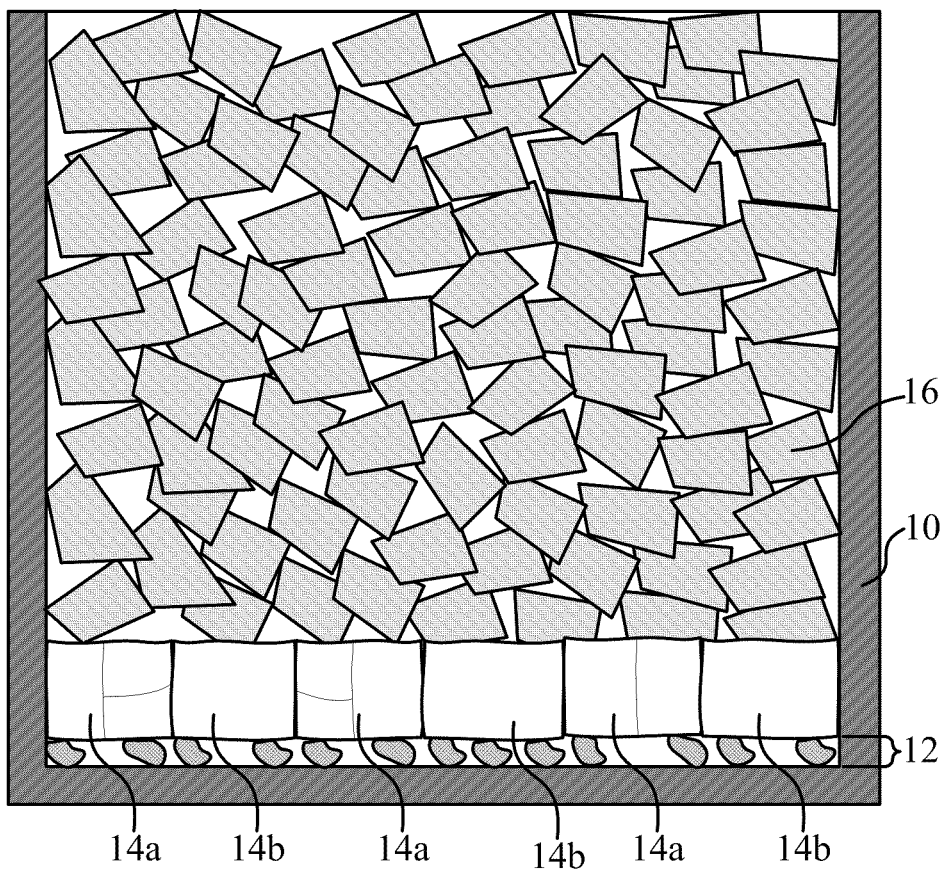

With reference to FIG. 1B, the method in accordance with the above embodiment comprises disposing the silicon feedstock 16 inside the mold 10, and on an exposure portion of the one or more silicon crystal seed 14a, 14b that are above the barrier layer 12. It is noted that the one or more silicon crystal seed 14a, 14b may be a single seed type that is disposed on positions above the barrier layer 12. The positions are corresponded to required positions for cooling process in succession. In an embodiment shown in FIG. 1A, the one or more silicon crystal seeds 14a, 14b cover on the barrier layer 12, and the silicon feedstock 16 is disposed on the one or more silicon crystal seed 14a, 14b.

Figure 1C:
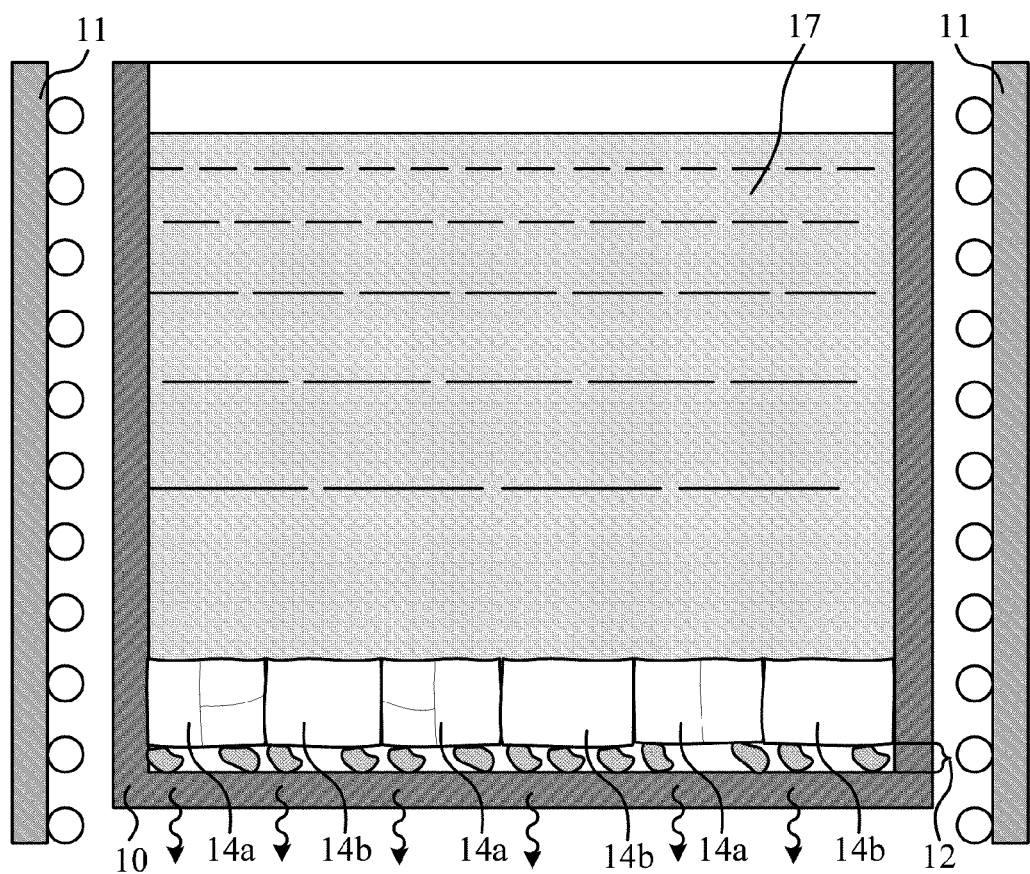

With reference to FIG. 1C, the method further comprises placing the mold 10 that is disposed with the barrier layer 12, the one or more silicon crystal seed 14a, 14b and the silicon feedstock 16 in a heater 11 and heating the mold 10 to obtain a silicon melt 17. At least one of the silicon crystal seeds 14a, 14b are kept in a supercooled state while heating until the silicon feedstock 16 is fully melted and the one or more silicon crystal seeds 14a, 14b are partially melted, (i.e. some parts of the silicon crystal seeds 14a, 14b are melted to reflow).

Figure 1D:
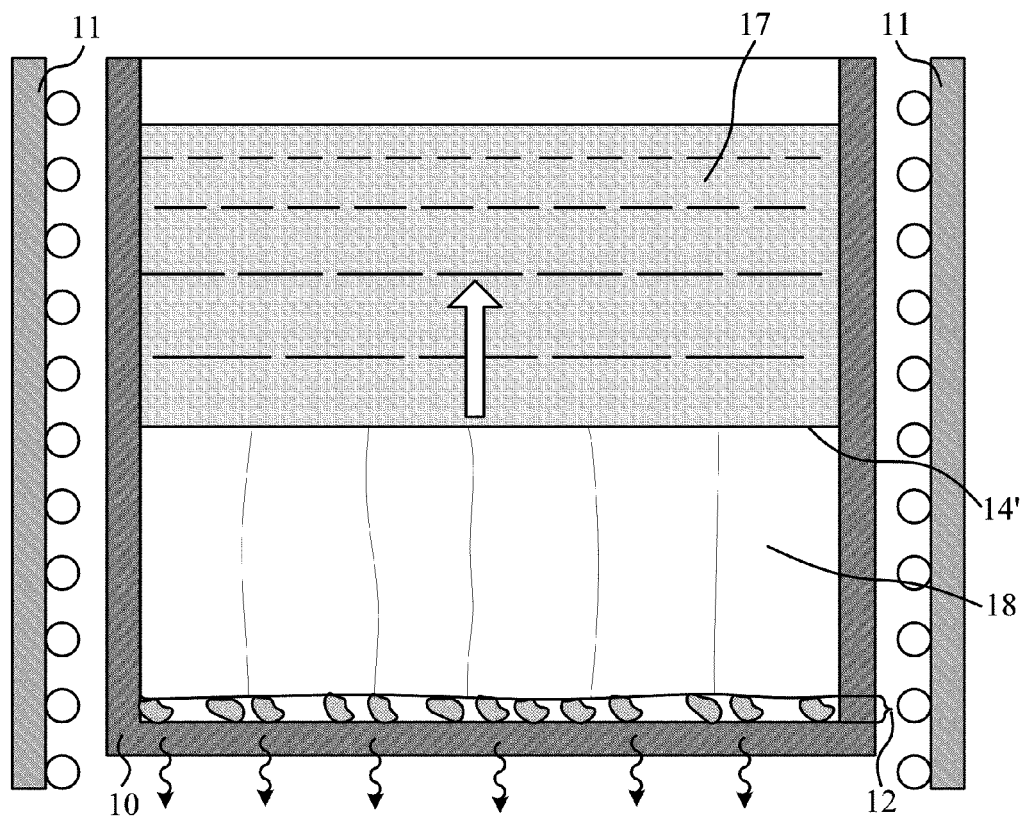

With reference to FIG. 1D, the method further comprises cooling the mold 10 by implementing a directional solidification process so that the silicon melt 17 is solidified from the bottom to an opening of the mold 10. As shown in FIG. 1D, a solid-liquid interface 14' (an interface between the solid phase and the liquid phase) between the silicon melt 17 and a solidified silicon ingot 18 moves toward the opening of the mold 10 during the cooling process.

Figure 1E:
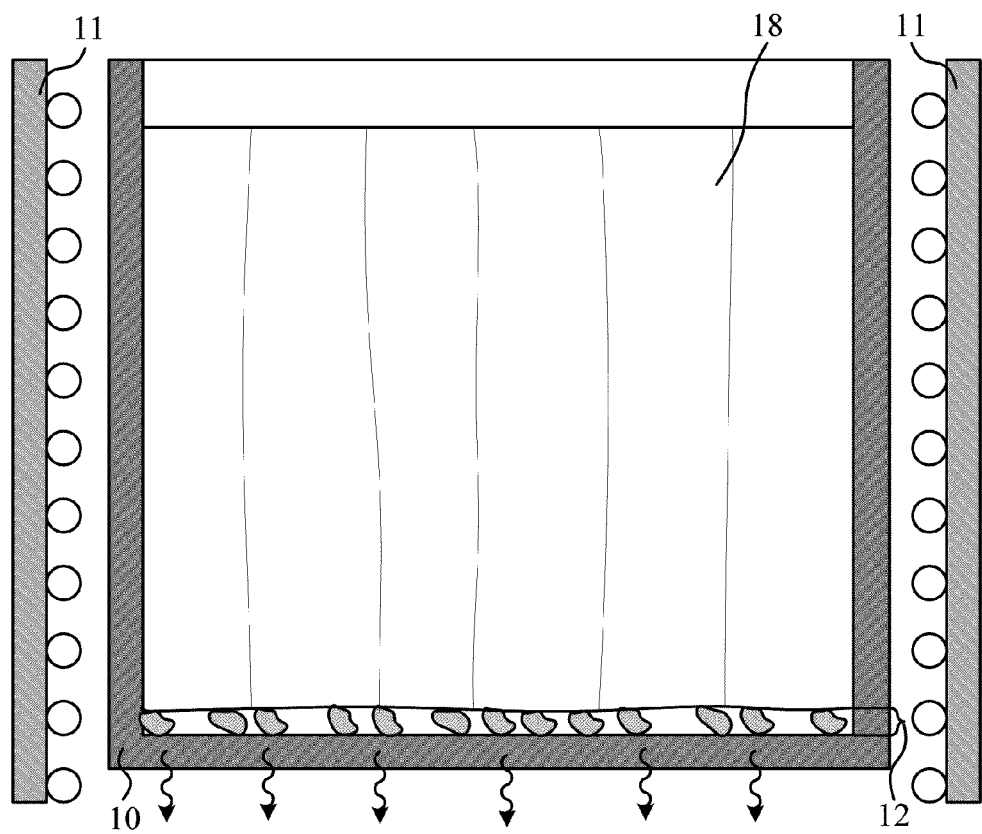

Eventually, as shown in FIG. 1E, the silicon melt 17 has been fully solidified to the silicon ingot 18 by implementing the directional solidification process. The silicon ingot 18 may be a mono-crystalline or poly-crystalline type, depending on the number of silicon crystal grains and arrangements of the silicon crystal seeds and the implementation of the directional solidification process. However, even the silicon ingot 18 is formed as a poly-crystalline type, some parts of the silicon ingot 18 may still grow in the mono-crystalline type due to the growth competitions of the silicon crystal grains.

Conventionally, when the silicon ingot 18 has been retrieved from the mold 10, a contacting area of the silicon ingot 18 is contaminated by the mold 10 and then cut off as waste. However, removing the barrier layer 12 between the silicon crystal seeds 14a, 14b and the bottom of the mold 10 in accordance with the embodiment significantly reduces contamination to the silicon ingot 18 by the crucible. Such barrier layer 12 can be removed by simply cutting off the barrier layer 12 and a minimum portion of the silicon ingot 18 that directly contacts the mold 10.

In order to prevent the silicon melt 17 flowing along the joints of the silicon crystal seeds 14a, 14b into the gaps among the barrier layer scraps, in an exemplary embodiment, one or more of the barrier layer scraps are placed corresponding to the joints of the silicon crystal seeds 14a, 14b.

In order to produce a silicon ingot 18 with a low defect density, the one or more silicon crystal seeds 14a, 14b, in this example, have the characteristics of a low defect density. The low defect density can be expressed in an etching pit density below $1 \times 10^5$ cm$^{-2}$, an average grain size larger than 2 cm, an impurity density smaller 10 ppma, or a combination thereof. The etching pit density can be measured by applying a corrosive liquid to a surface thereof and then measuring the resulted pits and the impurity can be determined by using the Inductively Coupled Plasma Mass spectrometry (ICP-MS).

Figure 2:
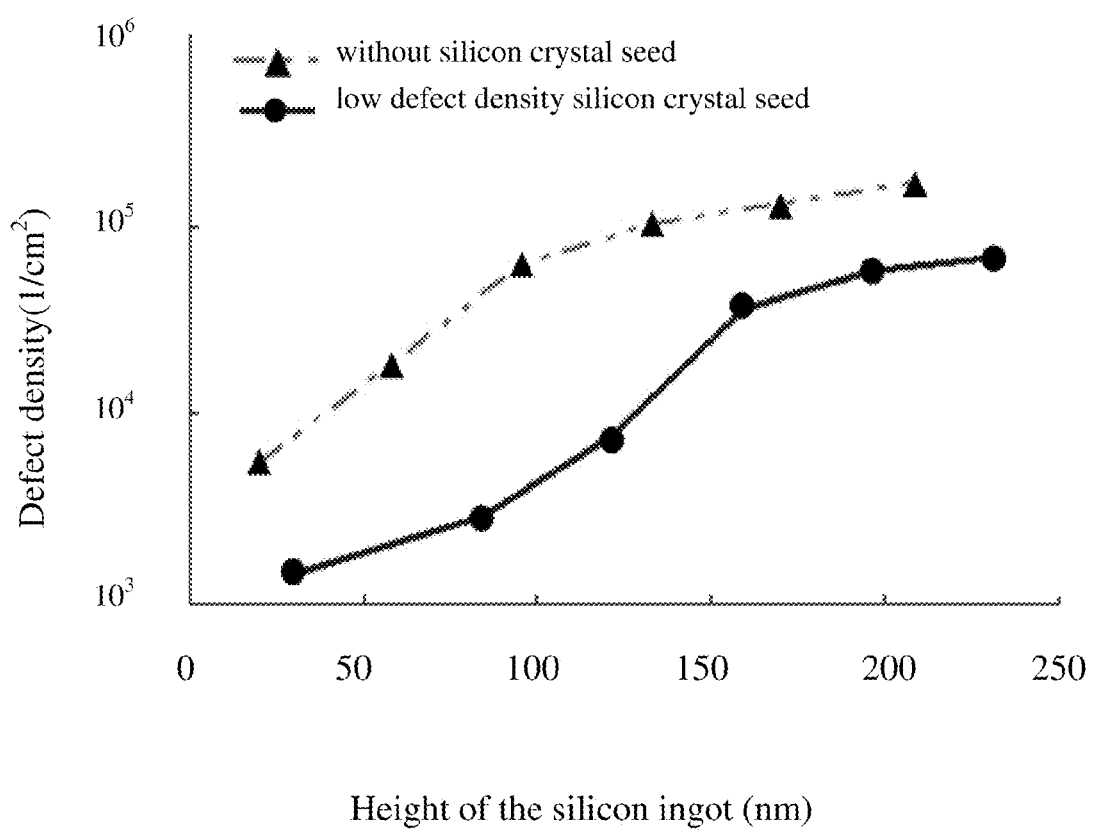
FIG. 2 is a graph of silicon ingots showing one manufactured using a silicon crystal seed and the other one manufactured without using a silicon crystal seed, respectively.

FIG. 2 is a graph of silicon ingots showing a comparison of a defect density (e.g. a density of etching pits) between with or without using of low defect density crystalline silicon crystal seeds in the manufacturing process. The graph shows the defect density (i.e. etching pit density) at the different height levels of the measured silicon ingots.

As evident from FIG. 2, the silicon ingot formed by using one or more low defect density mono-crystalline silicon crystal seeds in accordance with the first embodiment has a smaller defect area than the silicon ingot formed without using the crystalline silicon crystal seeds. Therefore, the manufacturing methods in accordance with the above-discussed embodiments provide greater manufacturing efficiencies and high quality silicon ingots.

Figure 3:
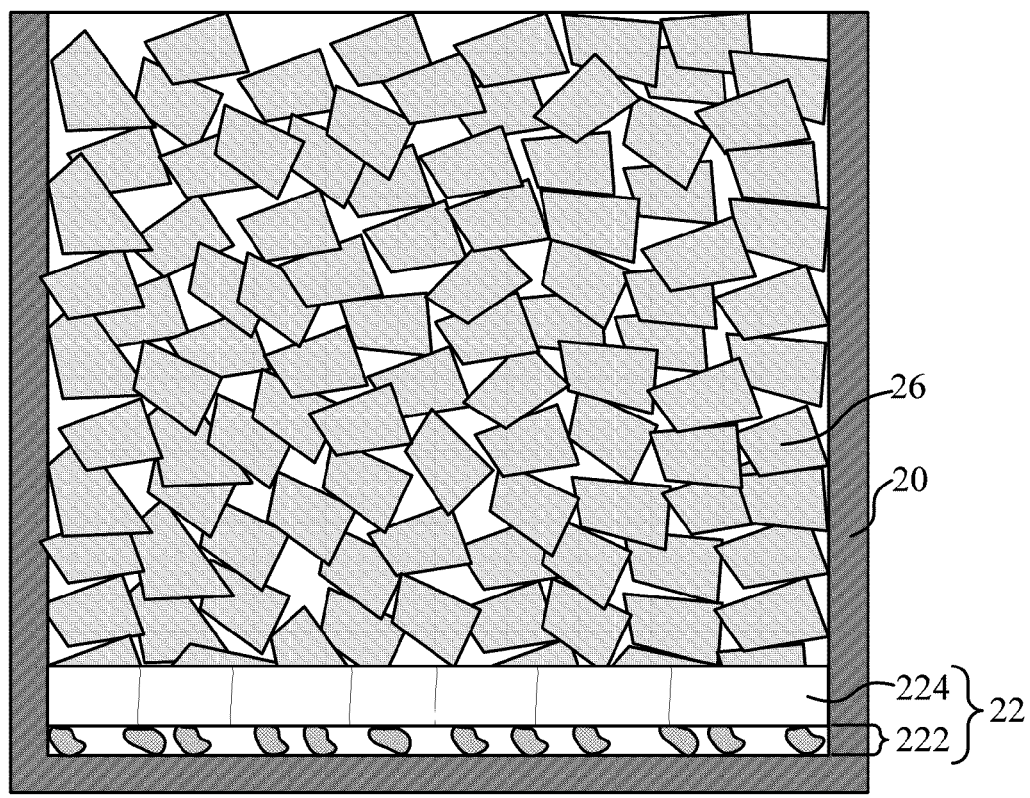
FIG. 3 is a cross-sectional view of exemplary illustration for manufacturing a crystalline silicon ingot according to a second embodiment.

FIG. 3 is a cross-sectional view of exemplary illustrations for manufacturing a crystalline silicon ingot according to a second embodiment.

As shown in FIG. 3, a method for manufacturing a crystalline silicon ingot first comprises providing a mold 20. The mold 20 is suitable for implementing a directional solidification process in melting and cooling a silicon feedstock. In this example, the mold 20 is the same as the mentioned mold 10 discussed in conjunction with FIG. 1A.

Further, a multi-layer structure 22 is provided and is loaded into the mold 20. The multi-layer structure 22 includes a barrier layer 222 and a silicon crystal seed layer 224. The barrier layer 222 contacts the silicon crystal seed layer 224 and is disposed onto a bottom of the mold 20. It is also noted that in order to manufacture more cost efficiently, the multi-layer structure 22 is obtained by recycling and reusing a bottom portion of a silicon ingot made by the above-discussed embodiments. For example, the manufactured silicon ingot 18 of FIGS. 1A to 1E, the bottom portion of the silicon ingot 18 inherently comprises a barrier layer and a silicon crystal seed layer. Thus, the multi-layer structure 22 can be obtained by simply cutting off a bottom portion of the previous made silicon ingot 18.

In an embodiment, the silicon crystal seed layer 224 includes one or more silicon crystal seeds.

Further, also shown in FIG. 3, a silicon feedstock 26 is loaded inside the mold 20, which is disposed above the silicon crystal seed layer 224.

Further, also shown in FIG. 3, the mold 20 loaded with the barrier layer 222, the silicon crystal seed layer 224 and the silicon feedstock 26 is put inside a heater 11 (same for the heater 11 shown in FIG. 1C) for heating to obtain a silicon melt. During the heating process, the silicon crystal seed layer 224 are kept in a supercooled state until the silicon feedstock 26 is fully melted and the one or more silicon crystal seed layer 224 is partially melted (i.e. some parts of the silicon crystal seed layer 224 are melted to reflow).

Eventually, the silicon melt is fully solidified to form the silicon ingot by cooling the mold 20 using the directional solidification process.

The crystal structure and the defect density of the silicon crystal seed layer 224 is the same as the above mentioned silicon crystal seeds 14a, 14b, and the structure and material of the barrier layer 222 is also the same as the above mentioned the barrier layer 12.

Figure 4:
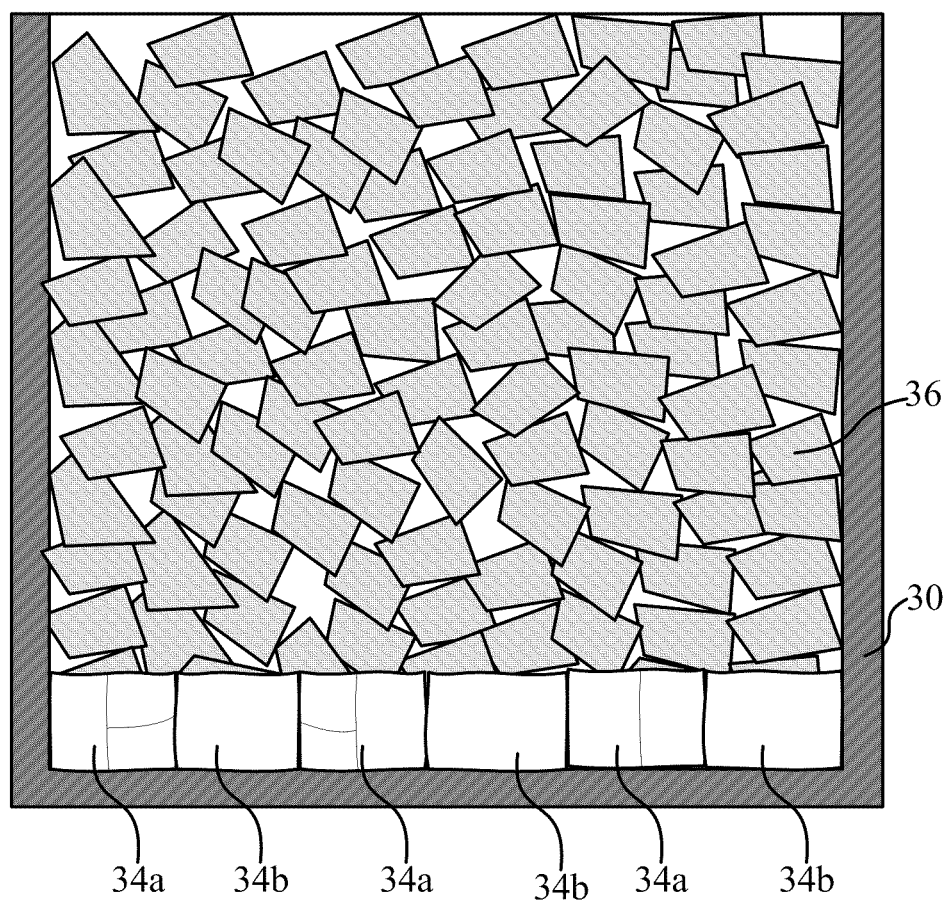
FIG. 4 is a cross-sectional view of exemplary illustration for manufacturing a crystalline silicon ingot according to a third embodiment.

FIG. 4 is a cross-sectional view of exemplary illustrations for manufacturing a crystalline silicon ingot according to a third embodiment.

As shown in FIG. 4, a method for manufacturing a crystalline silicon ingot first comprises providing a mold 30 in accordance with an embodiment. The mold 30 is suitable for implementing a directional solidification process in melting and cooling a silicon feedstock.

Further, as shown in FIG. 4, one or more silicon crystal seeds 34a, 34b are loaded into the mold 30, and at least one of the silicon crystal seeds 34a, 34b includes two or more silicon crystal grains. The one or more silicon crystal seeds 34a, 34b may be mono-crystalline silicon crystal seeds (e.g. 34b in FIG. 4) cut from a mono-crystalline silicon ingot, a tail material, a recycled silicon wafer, etc. The one or more silicon crystal seeds 34a, 34b may also be poly-crystalline silicon crystal seeds (e.g. 34a in FIG. 4). Further, the silicon crystal seed 34a, 34b may also be mixed with the poly-crystalline silicon crystal seeds 34a and the mono-crystalline silicon crystal seeds 34b, and fully covers the bottom of the mold 30. For example, as shown in FIG. 4, the poly-crystalline silicon crystal seeds 34b and the mono-crystalline silicon crystal seeds 34a fully cover the bottom of the mold 30.

In particular, each silicon crystal seed 34a, 34b includes one or more silicon grains, and has the characteristic of a low defect density. The low defect density can be expressed as an etching pit density below $1 \times 10^5$ cm$^{-2}$, an average grain size larger than 2 cm, an impurity density smaller 10 ppma, or a combination thereof. The etching pit density can be measured by using the corrosive liquid as discussed, and the impurity can be determined by using an Inductively Coupled Plasma Mass spectrometry (ICP-MS).

Further, also shown in FIG. 4, the silicon feedstock 36 is loaded inside the mold 30, which is disposed above the one or more silicon crystal seeds 34a, 34b.

Further, also shown in FIG. 4, as the silicon crystal seed 34a, 34b and the silicon feedstock 36 filed into the mold 30, and the mold 30 is put inside a heater 11 (the same as the heater 11 shown in FIG. 1C) for the heating process to obtain a silicon melt. During the heating process, the silicon crystal seed 34a, 34b are kept in a supercooled state until the silicon feedstock 36 is fully melted and the one or more silicon crystal seeds 34a, 34b are partially melted (i.e. some parts of the silicon crystal seeds 34a, 34b are melted to reflow).

Eventually, the silicon melt has been fully solidified into the silicon ingot under the directional solidification process for cooling the mold 30.

Accordingly, the manufacturing methods in accordance with the exemplary embodiments manufacture a crystalline silicon ingot with a low defect density, lower manufacturing cost, and significantly reduce contamination from the crucible problem. The methods further reuse and recycle the silicon crystal seeds and the barrier layer.

While the exemplary embodiments have been described in connection with a number of embodiments and implementations, the exemplary embodiments are not so limited but cover various obvious modifications and equivalent arrangements, which fall within the purview of the appended claims. Although features of the exemplary embodiments are expressed in certain combinations among the claims, it is contemplated that these features can be arranged in any combination and order.

What is claimed is:

1. A method for manufacturing a crystalline silicon ingot comprising:
   providing a mold for melting and cooling a silicon feedstock using a directional solidification process;
   disposing a barrier layer inside the mold, wherein the barrier layer comprises a plurality of scraps;
   disposing one or more silicon crystal seeds on the barrier layer inside the mold such that the barrier layer is disposed between the silicon crystal seeds and a bottom of the mold, wherein the barrier layer is disposed on the bottom of the mold such that the silicon crystal seeds are separated a distance from the bottom of the mold and gaps are formed between the plurality of scraps;
   loading the silicon feedstock on the silicon crystal seeds;
   obtaining a silicon melt by heating the mold until the silicon feedstock is fully melted and the silicon crystal seeds are at least partially melted, wherein the barrier layer is not melted during the heating;
   cooling the mold by the directional solidification process to solidify the silicon melt into a silicon ingot;
   retrieving the silicon ingot from the mold;
   removing the barrier layer and a portion of the silicon ingot that directly contacts the sides of the mold from the silicon ingot; and
   using the removed barrier layer and the portion of the silicon ingot as another barrier layer for making another crystalline silicon ingot,
   wherein the barrier layer is made from a material selected from a group consisting of high purity graphite, aluminum oxide, aluminum nitride, carbide, nitride, oxide, and a combination thereof.

2. The method as claimed in claim 1, wherein the silicon crystal seeds are selected from a group consisting of one or more poly-crystalline silicon crystal seeds and one or more mono-crystalline silicon crystal seeds.

3. The method as claimed in claim 1, wherein the silicon crystal seeds have an etching pit density below $1 \times 10^5$ cm$^{-2}$, an average grain size larger than 2 cm, an impurity density smaller than 10 ppma, or a combination thereof.

4. The method as claimed in claim 1, wherein a diffusivity of impurities in the barrier layer is smaller than a diffusivity of impurities in the mold.

5. The method as claimed in claim 1, wherein the plurality of scraps of the barrier layer are placed corresponding to joints of the silicon crystal seeds.

6. The method as claimed in claim 1, wherein the scraps are randomly distributed.

7. A method for manufacturing a crystalline silicon ingot comprising:
   providing a mold for melting and cooling a silicon feedstock by using a directional solidification process;
   disposing a multi-layer structure inside the mold, wherein the multi-layer structure comprises at least one silicon crystal seed layer and a barrier layer disposed onto a bottom of the mold, wherein the barrier layer comprises a plurality of scraps and is disposed between the silicon crystal seed layer and the bottom of the mold, and wherein the barrier layer is disposed on the bottom of the mold such that the silicon crystal seeds are separated a distance from the bottom of the mold and gaps formed between the plurality of scraps;
   loading the silicon feedstock on the silicon crystal seed layer inside the mold;
   obtaining a silicon melt by heating the mold until the silicon feedstock is fully melted and the silicon crystal seed layer is at least partially melted, wherein the barrier layer is not melted during the heating;
   cooling the mold by the directional solidification process to solidify the silicon melt into a silicon ingot;
   retrieving the silicon ingot from the mold;
   removing the barrier layer and a portion of the silicon ingot that directly contacts the mold from the silicon ingot; and
   using the removed barrier layer and the portion of the silicon ingot as another barrier layer for making another crystalline silicon ingot,
   wherein the barrier layer is made from a material selected from a group consisting of high purity graphite, aluminum oxide, aluminum nitride, carbide, nitride, oxide, and a combination thereof.

8. The method as claimed in claim 7, wherein the silicon crystal seed layer comprises at least one silicon crystal grain.

9. The method as claimed in claim 7, wherein the silicon crystal seed layer has an etching pit density below $1 \times 10^5$ cm$^{-2}$, an average grain size larger than 2 cm, an impurity density smaller 10 ppma, or a combination thereof.

10. The method as claimed in claim 7, wherein a diffusivity of impurities in the barrier layer is smaller than a diffusivity of impurities in the mold.

* * * * *